US012701927B2

(12) United States Patent
Bertrand et al.

(10) Patent No.: US 12,701,927 B2
(45) Date of Patent: Aug. 4, 2026

(54) QUANTUM DEVICE FOR FORMING AN ARRAY OF QUANTUM DOTS AND ASSOCIATED MANUFACTURING METHOD

(71) Applicant: COMMISSARIAT À L'ENERGIE ATOMIQUE ET AUX ENERGIES ALTERNATIVES, Paris (FR)

(72) Inventors: Benoit Bertrand, Grenoble Cedex (FR); Thomas Bedecarrats, Grenoble Cedex (FR); Heimanu Niebojewski, Grenoble Cedex (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 343 days.

(21) Appl. No.: 18/390,513

(22) Filed: Dec. 20, 2023

(65) Prior Publication Data

US 2025/0017120 A1     Jan. 9, 2025

(30) Foreign Application Priority Data

Dec. 20, 2022    (FR) ........................................ 2213999

(51) Int. Cl.
H10N 60/10          (2023.01)
H10D 30/01          (2025.01)
(Continued)

(52) U.S. Cl.
CPC ......... H10N 60/128 (2023.02); H10D 30/014 (2025.01); H10D 48/3835 (2025.01); (Continued)

(58) Field of Classification Search
CPC .. H10N 60/128; B82Y 10/00; H10D 48/3835; H10D 30/014; H10D 62/115; H10D 62/118; H10D 64/27
See application file for complete search history.

(56) References Cited

U.S. PATENT DOCUMENTS 10,387,792 B1     8/2019  Ladd et al.
2021/0296556 A1*  9/2021  Hsu .................... H10D 48/3835
(Continued)

FOREIGN PATENT DOCUMENTS

EP          2 075 745 A1     7/2009
EP          3 975 072 A1     3/2022
(Continued)

OTHER PUBLICATIONS

Search Report as issued in French Patent Application No. 2213999, dated Nov. 16, 2023.
(Continued)

*Primary Examiner* — David Vu
*Assistant Examiner* — Brandon C Fox
(74) *Attorney, Agent, or Firm* — CUSHMAN PARTNERS, LLC

(57)          ABSTRACT

A quantum device configured to be able to form an array of quantum dots, the device including for this: an active layer made of a semiconductor material; a plurality of first gates disposed along a plurality of rows; a plurality of second gates disposed along a plurality of columns perpendicular to the rows of the plurality of rows; a plurality of third gates, each third gate of the plurality of third gates being disposed at the intersection of one row of the plurality of rows and one column of the plurality of columns, each third gate being separated from the nearest third gates, on a row by a first gate and on a column by a second gate; the active layer including apertures over the entire thickness of the active layer disposed between the rows of the plurality of rows and the columns of the plurality of columns.

16 Claims, 9 Drawing Sheets

(51) Int. Cl.

| | |
|---|---|
| *H10D 48/00* | (2025.01) |
| *H10D 62/10* | (2025.01) |
| *H10N 60/01* | (2023.01) |
| *B82Y 10/00* | (2011.01) |
| *H10D 64/27* | (2025.01) |

(52) U.S. Cl.
CPC ......... *H10D 62/115* (2025.01); *H10D 62/118* (2025.01); *H10N 60/01* (2023.02); *H10N 60/11* (2023.02); *B82Y 10/00* (2013.01); *H10D 64/27* (2025.01)

(56) References Cited

U.S. PATENT DOCUMENTS

| | | | | |
|---|---|---|---|---|
| 2023/0086994 A1* | 3/2023 | Mortemousque | .. | G05B 19/4099 700/121 |
| 2025/0169379 A1* | 5/2025 | Bertrand | ................ | H10D 64/27 |

FOREIGN PATENT DOCUMENTS

| | | | |
|---|---|---|---|
| EP | 4 167 290 | A1 | 4/2023 |
| FR | 3 066 297 | A1 | 11/2018 |
| WO | WO 2021/194995 | A1 | 9/2021 |

OTHER PUBLICATIONS

Veldhorst, M., et al., "Silicon CMOS architecture for a spin-based quantum computer," Nature Communications, vol. 8, No. 1, Dec. 2017, Retrieved from the Internet: URL:https://www.nature.com/articles/s41467-017-01905-6.pdf>, XP093006683, 8 pages.

Tadokoro, M., et al., "Designs for a two-dimensional Si quantum dot array with spin qubit addressability," arxiv.org, Cornell University Library, Jun. 2021, XP081992755, 15 pages.

Fowler, A. G., et al., "Towards practical classical processing for the surface code," arxiv.org, Cornell University Library, May 2012, 5 pages.

Li, R., et al. "A crossbar network for silicon quantum dot qubits," Science Advances Research Article, Jul. 2018, 11 pages.

* cited by examiner

[Fig. 1]
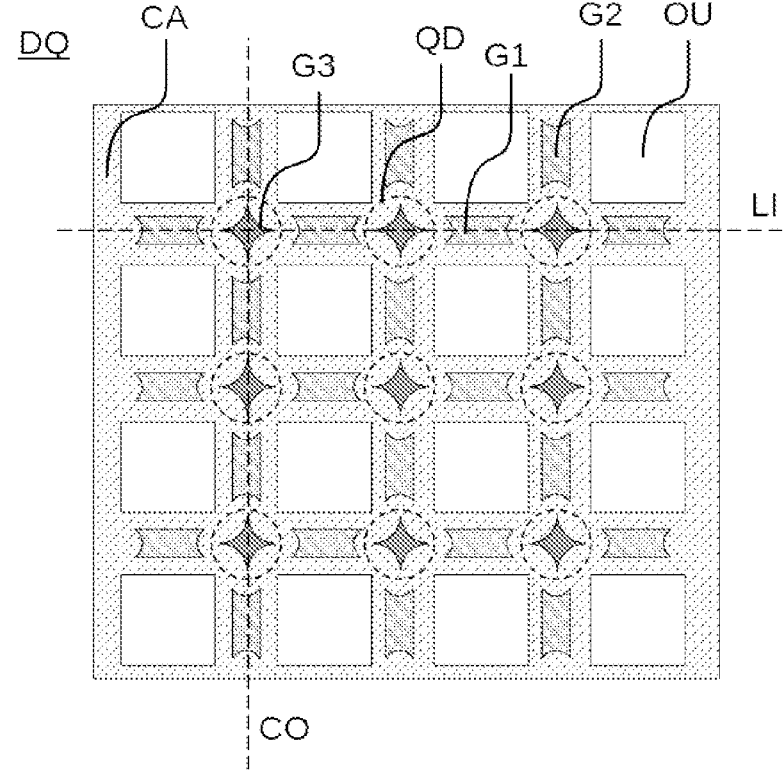
[Fig. 2A]
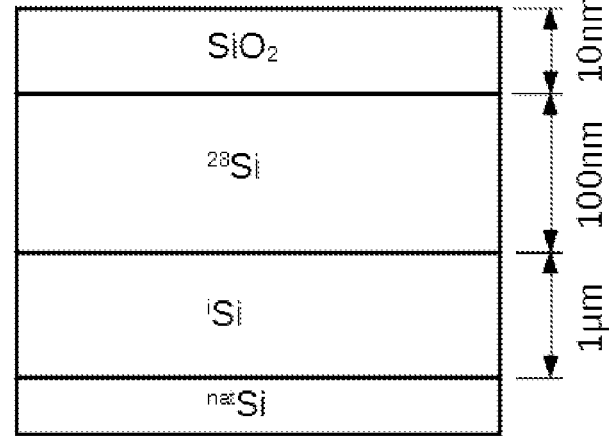

[Fig. 2B]
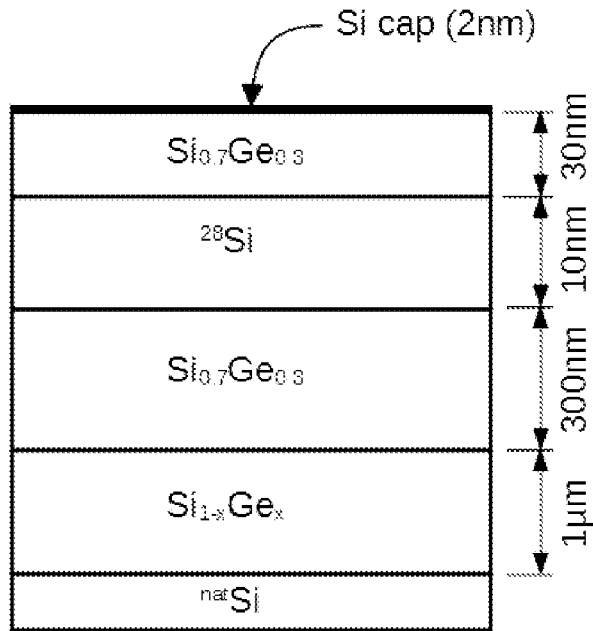
[Fig. 2C]
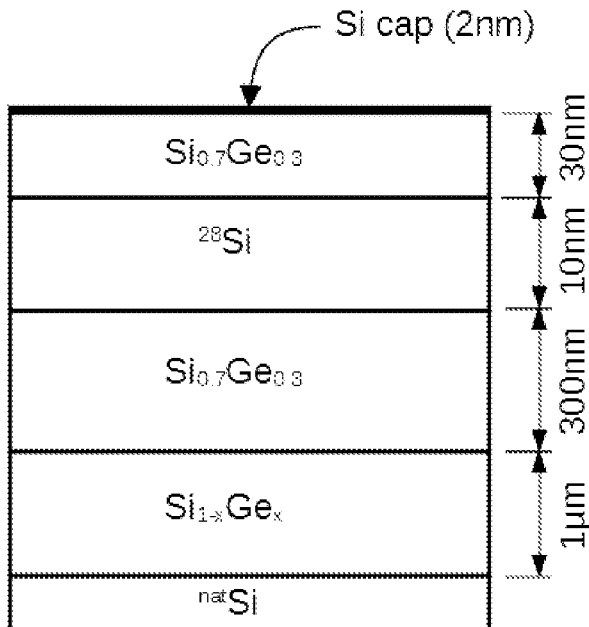

[Fig. 3]
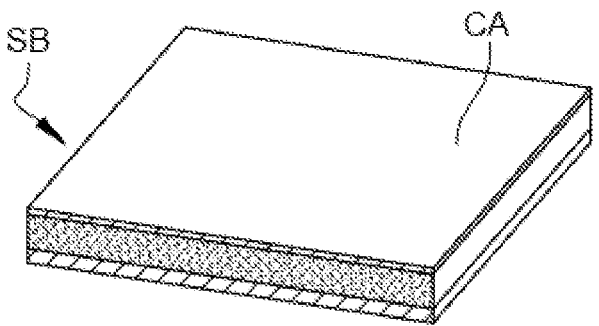
[Fig. 4A]
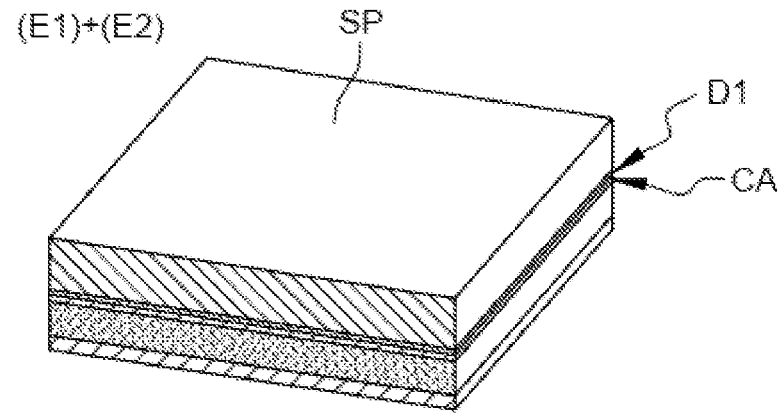
[Fig. 4B]
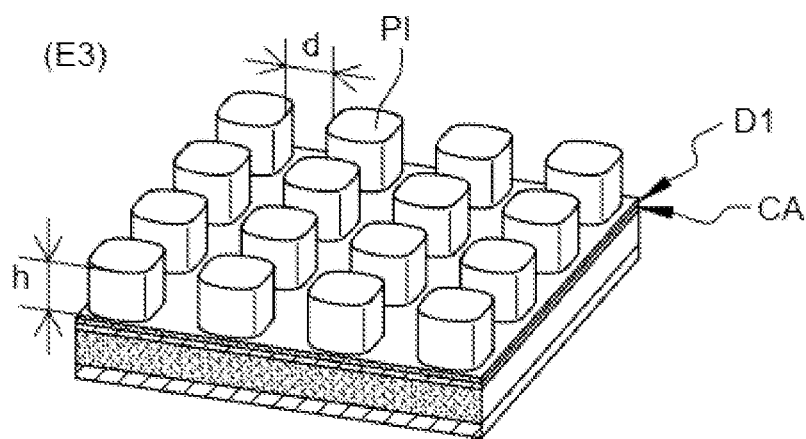

[Fig. 4C]
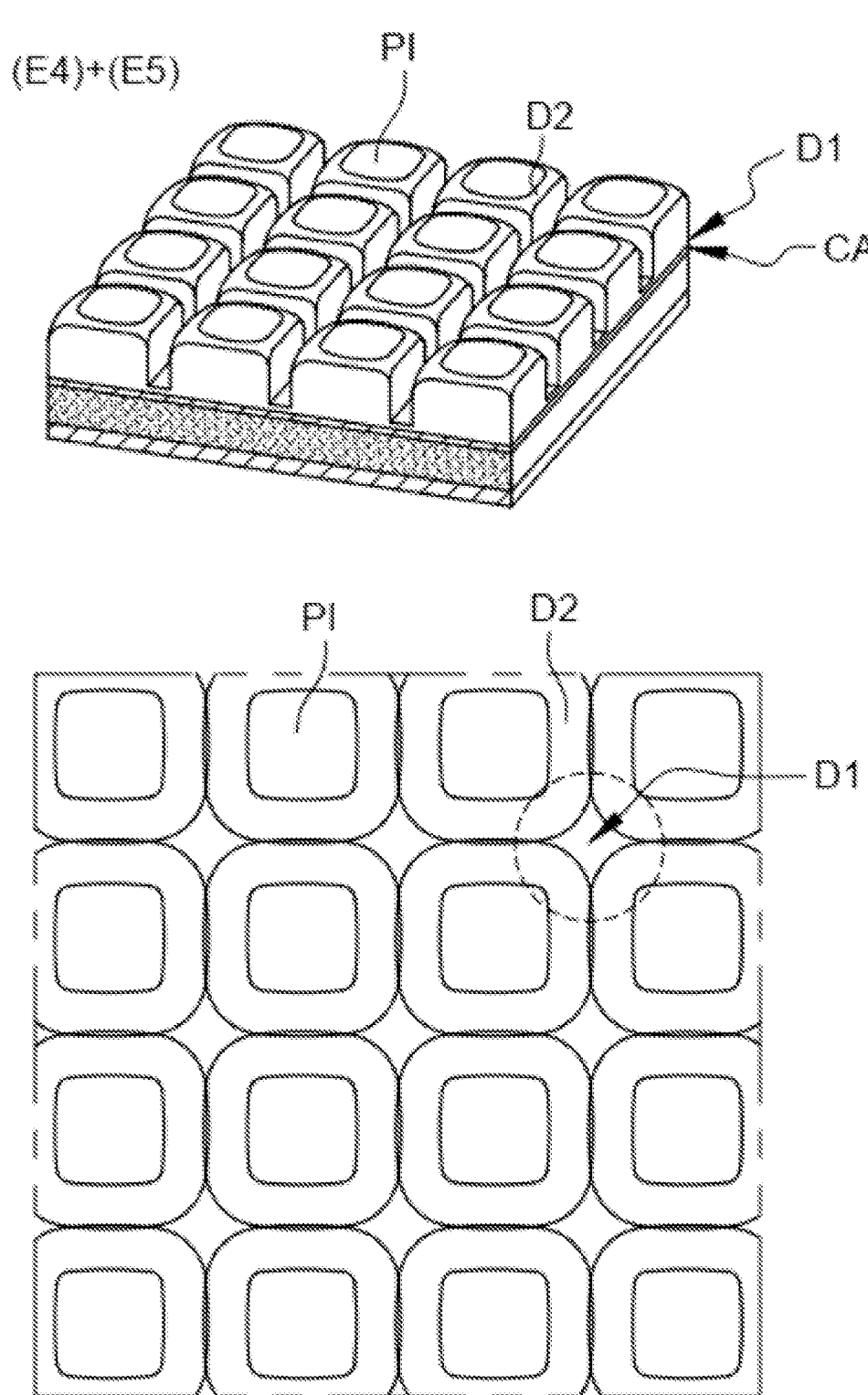

[Fig. 4D]
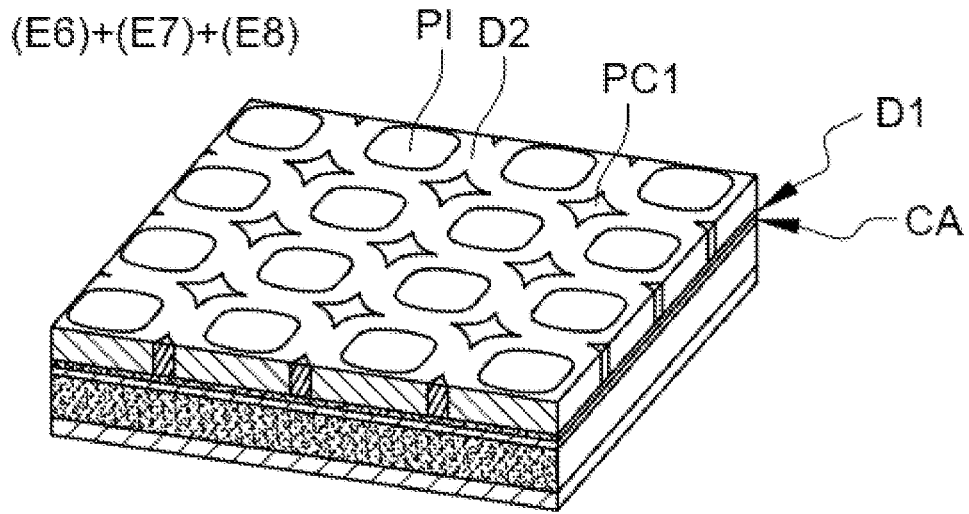
(E6)+(E7)+(E8)    PI   D2    PC1      D1    CA
[Fig. 4E]
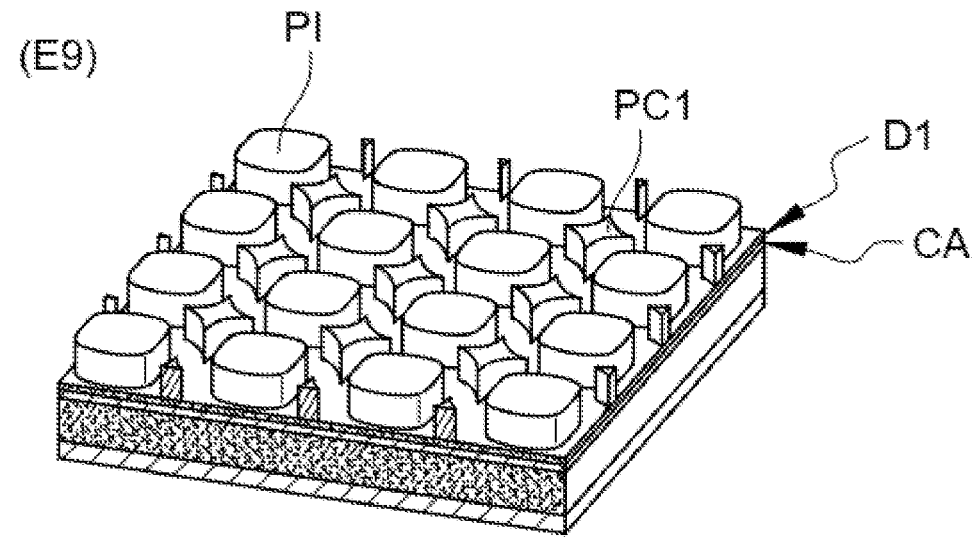
(E9)    PI      PC1    D1    CA

[Fig. 4F]
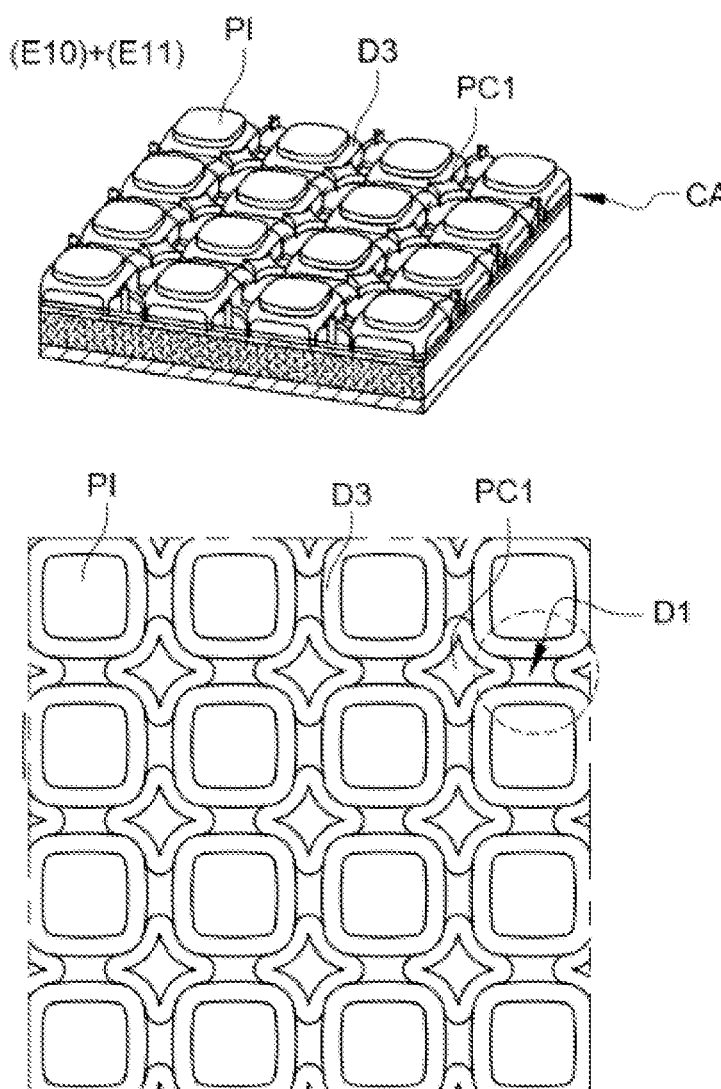

[Fig. 4G]
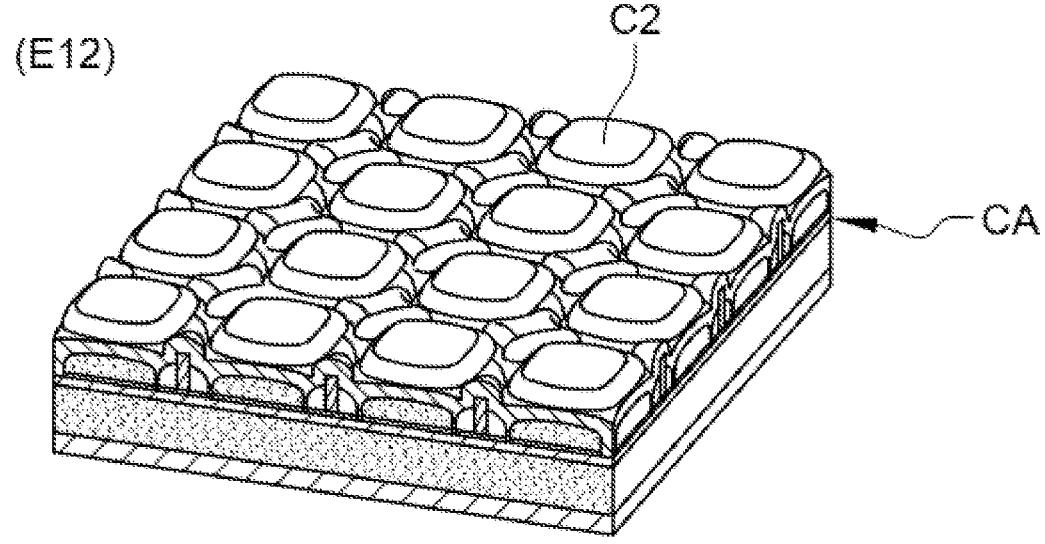
[Fig. 4H]
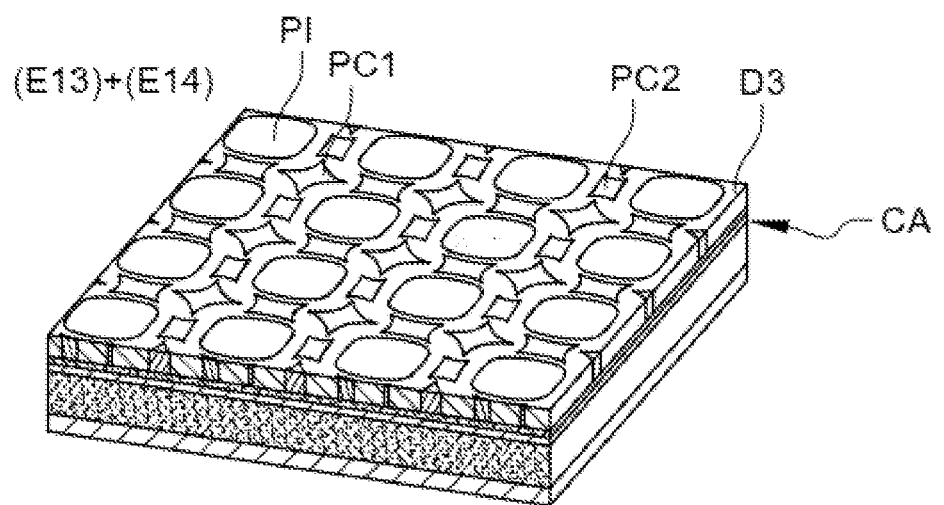

[Fig. 4I]
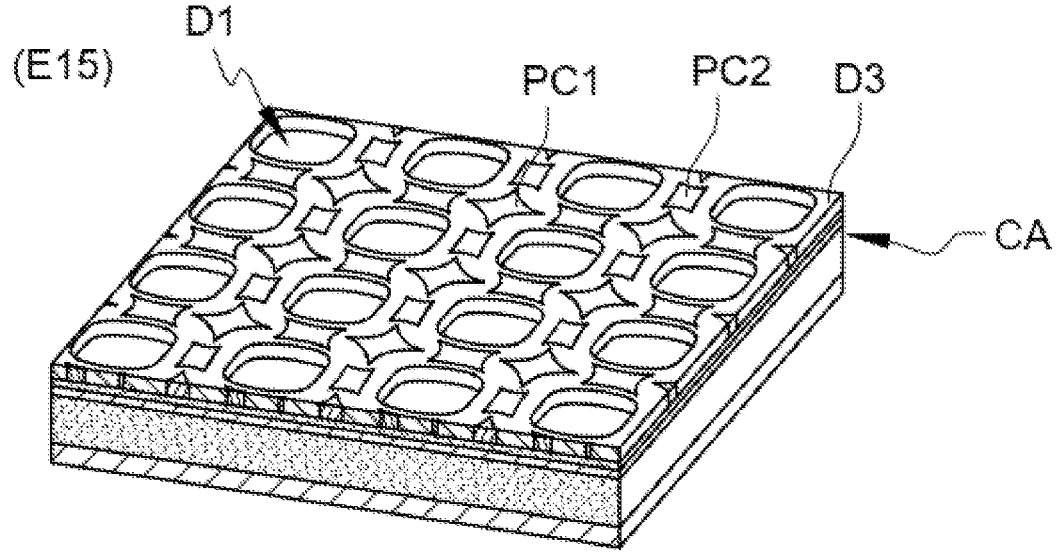
[Fig. 4J]
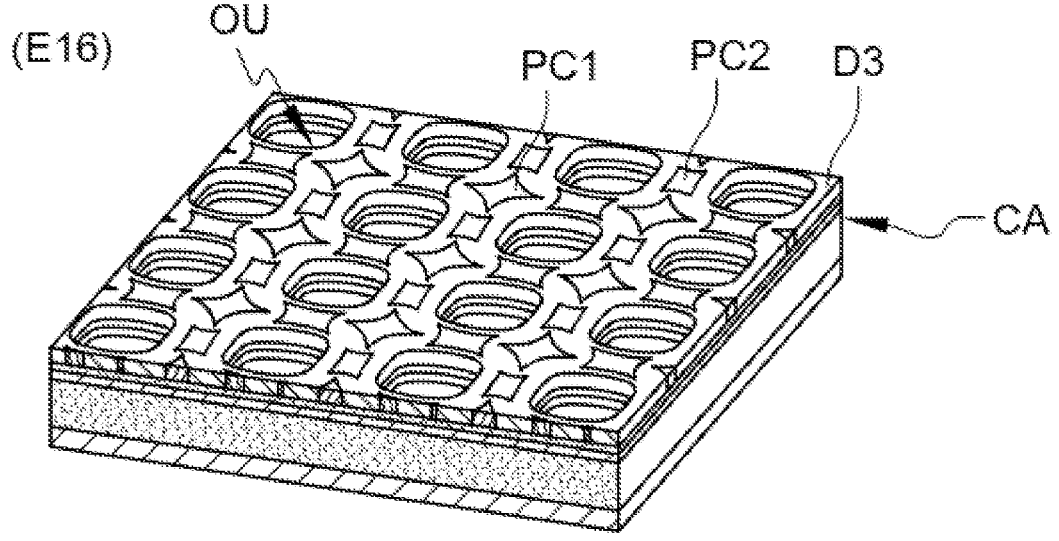

[Fig. 4K]
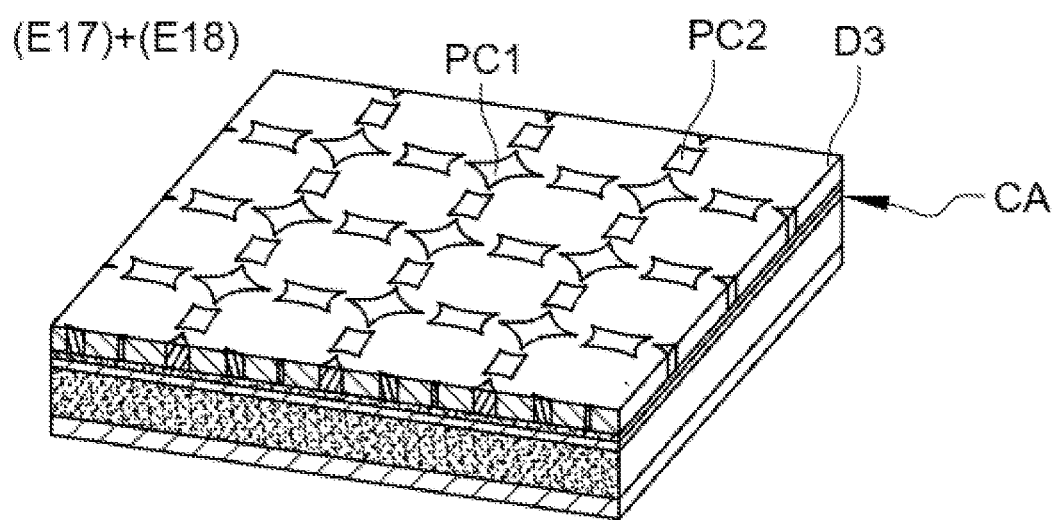

QUANTUM DEVICE FOR FORMING AN ARRAY OF QUANTUM DOTS AND ASSOCIATED MANUFACTURING METHOD

CROSS-REFERENCE TO RELATED APPLICATIONS

This application claims priority to French Patent Application No. 2213999, filed Dec. 20, 2022, the entire content of which is incorporated herein by reference in its entirety.

FIELD

The technical field of the invention is that of quantum computing.

The present invention relates to a semiconductor device comprising means for forming an array of quantum dots and in particular a device for controlling the chemical potential within each quantum dot and the coupling between adjacent quantum dots, this control being performed locally, while guaranteeing the absence of charged particles outside the quantum dots. This invention also relates to a method for manufacturing such a device.

BACKGROUND

In the field of quantum computing, it is known to use quantum dots in which one or more charged particles can be trapped in order to be manipulated. For this, confinement of the charged particles has to be performed in all three dimensions of space. According to the state of the art, such confinement can be achieved in two ways (which can be used in combination): structurally (by alternating materials in at least one dimension of space) and/or electrostatically by applying a potential to a portion of conductive material (using a gate electrode, for example). In general, the quantum dots are arranged in the form of an array of quantum dots which allows better inter-connectivity between quantum dots and thus, for example, more efficient execution of quantum error correction algorithms (see for example Fowler, Phys. Rev. A, 2012).

For example, an array of quantum dots has been provided in document Li et al, Science, 2018. In this document, the authors provide a structure with three gate tiers: along the rows, columns and diagonals of the array of quantum dots, these gate tiers allowing control of the chemical potential in each quantum dot and the potential barriers (or tunnel coupling) between adjacent quantum dots. On the other hand, the device does not allow total control of the position of the charged particles and, in particular, does not forbid their presence outside the quantum dots, that is, between the rows and columns of the array of quantum dots. Additionally, the use of three gate tiers implies screening of the upper gate tiers by the lower gate tiers, which results in a strong disparity between the different gate tiers (the first-tier gate appears continuous, whereas the second- and third-tier gates take the form of a dotted line).

Another architecture has been provided in document FR3066297. In the latter, the active layer of the array of quantum dots is structured so as to forbid the presence of charged particles outside the quantum dots, that is, between the rows and columns of the array of quantum dots. Moreover, the device provided also comprises a plurality of gates for controlling the potential barriers between adjacent quantum dots in the array of quantum dots. On the other hand, due to the difficulty of implementation, the provided device does not comprise a gate allowing local control of the chemical potential within each quantum dot. Furthermore, gate control is carried out using vias, which allows good homogeneity between the gates, but also imposes very strict restrictions in terms of the relative alignment of the different gate tiers, thus making the manufacturing method complex to implement.

There is therefore a need for a device that makes it possible to obtain homogeneous electrostatic control, local control (that is, by a gate located above the element to be controlled) of the chemical potential within each quantum dot and a means for guaranteeing the absence of electrical charge between the rows and columns of the array. Furthermore, there is a need for a method for obtaining such a device without imposing very strict alignment restrictions during manufacture.

SUMMARY

An aspect of the invention offers a solution to the problems discussed previously, by providing a device which makes it possible to obtain both homogeneous electrostatic control, local control (that is, by a gate located directly above the element to be controlled) of the chemical potential within each quantum dot and a means for guaranteeing the absence of charged particles between the rows and columns of the array. This is achieved especially by virtue of a method which makes it possible to make the gates and the patterns between the rows and columns of the array of quantum dots in a self-aligned manner and on a single lithography tier.

For this, a first aspect of the invention relates to a quantum device configured to form an array of quantum dots, the device comprising:

An active layer made of a semiconductor material;

A plurality of first gates disposed along a plurality of rows;

A plurality of second gates disposed along a plurality of columns perpendicular to the rows of the plurality of rows;

a plurality of third gates, each third gate of the plurality of third gates being disposed at the intersection of a row of the plurality of rows and a column of the plurality of columns, each third gate being separated from the nearest third gates, on a row by a first gate and on a column by a second gate;

the active layer comprising apertures over the entire thickness of the active layer disposed between the rows of the plurality of rows and the columns of the plurality of columns.

Beneficially, each first gate of the plurality of first gates extends entirely over the active layer and each second gate of the plurality of second gates extends entirely over the active layer.

By virtue of the device according to an aspect of the invention, it is possible to obtain a device allowing homogeneous electrostatic control, local control (by a gate located directly above the element to be controlled) of the chemical potential within each quantum dot and a means for guaranteeing the absence of electrical charge between the rows and columns of the array. More particularly, in the device according to an aspect of the invention, a quantum dot can be formed below each third gate so as to form an array of quantum dots. Indeed, each first gate of the plurality of first gates makes it possible, when an electrical potential is applied thereto, to modify potential barrier separating two parts of the active layer located under two adjacent third gates along the rows. Similarly, each second gate of the plurality of second gates makes it possible, when an electrical potential is applied thereto, to modify potential barrier separating two parts of the active layer located under two adjacent third gates along the columns. Additionally, the first gates and second gates enable this modification to be performed locally, as the latter are not "screened" by a conductive layer (in other words, there is no conductive layer between the oxide of the first gates and second gates and the active layer). Also, by virtue of the control of the potential barriers exerted by the first gates and the second gates, it is possible to achieve electrostatic confinement of the charged particles below the third gates of the plurality of third gates to form a quantum dot under each third gate. This electrostatic confinement is further supplemented by structural confinement obtained by virtue of the apertures present in the active layer, since no charged particles can be located at said apertures.

Furthermore, in each quantum dot, the charged particle(s) present are associated with a chemical potential. But, since each third gate is not "screened" by a conductive layer (in other words, there is no conductive layer between the oxide of the third gates and the active layer), each third gate of the plurality of third gates makes it possible, when an electric potential is applied thereto, to modify chemical potential of the charged particles present in the quantum dot associated with the third gate in question.

Further to the characteristics just discussed in the previous paragraph, the device according to the first aspect of the invention may have one or more additional characteristics from among the following, considered individually or according to any technically possible combinations.

In one embodiment, each third gate of the plurality of third gates extends entirely over the active layer.

In one embodiment, each gate of the plurality of first, second, third and fourth gates extends over a first dimension, referred to as the first width, measured along a row or a column, the active layer having a second dimension, referred to as the second width, measured along said row or said column, greater than or equal to the first width.

In one embodiment, each first gate and each second gate has a length and a thickness strictly less than the length. The length is in an embodiment measured parallel to the active layer and the thickness is in an embodiment measured perpendicular to the active layer.

In one embodiment, each first gate has a length and a width, less than or equal to the length, each first gate being arranged so that its length is aligned with one row of the plurality of rows. In an embodiment, each second gate has a length and a width, less than or equal to the length, each second gate being arranged so that its length is aligned with one column of the plurality of columns.

In one embodiment, each third gate has a four-pointed star shape with a first diagonal, passing through two opposite points, parallel to one row of the plurality of rows, and with a second diagonal, distinct from the first diagonal and passing through two other opposite points, parallel to one column of the plurality of columns.

In one embodiment, each first gate has a rectangular shape in which a third diagonal, passing through two opposite points, has an angle of less than or equal to 45° with one row of the plurality of rows; each second gate also has a rectangular shape in which a fourth diagonal, passing through two opposite points, has an angle of less than or equal to 45° with one column of the plurality of columns.

In one embodiment, the first, second and third gates are arranged at the same distance from the active layer.

In one embodiment, the device comprises a first dielectric layer extending over the active layer, each first gate, each second gate and each third gate extending over the first dielectric layer. The first dielectric layer is in an embodiment common to all the gates.

In one embodiment, the plurality of first gates is polarizable independently of the plurality of third gates.

In one embodiment, the plurality of second gates is independently polarizable from the plurality of third gates.

In one embodiment, each plurality of gates among the pluralities of first, second and third gates is polarizable independently of the other pluralities of gates among the pluralities of first, second and third gates.

In one embodiment, each of the first, second and third gate is polarised independently of the other of the first, second and third gates.

By "gate which can be polarised independently of the other gates" is meant that it is possible to apply an electrical potential to the said gate without applying the said potential to the other gates.

By "plurality of first gates polarizable independently of another plurality of gates" is meant that it is possible to apply an electrical potential to each of the first gates, to a subset of the first gates, or to all of the first gates, without applying said potential to any other gate of the other plurality of gates.

In one embodiment, each first gate is independently polarizable from the other first gates and from the second and third gates; and each second gate is independently polarizable from the other second gates and from the first and third gates; and each third gate is independently polarizable from the other third gates and from the first and second gates.

In one embodiment, the device is made from a substrate of the "silicon on insulator" (SOI) type, the active layer being made in the silicon layer of the substrate located above the oxide.

In one embodiment, the device is made from a bulk silicon substrate. Beneficially, the substrate comprises an epitaxial silicon layer covered with a thermal oxide. In this embodiment, the active layer being made in the, in an embodiment epitaxial, silicon layer.

In one embodiment, the device is made from an Si/SiGe heterostructure, the active layer being made in the Si layer.

In one embodiment, the device is made from a Ge/SiGe heterostructure, the active layer being made in the Ge layer.

In one embodiment, the device comprises spacers disposed so as to separate each first gate, second gate and third gate from adjacent first gates, second gates and third gates.

In one embodiment, the device beneficially comprises spacers arranged so as to:
   separate each first gate from adjacent first, second and third gates;
   separate each second gate from adjacent first, second and third gates; and
   separate each third gate from the adjacent first, second and third gates.

In one embodiment, each first gate, second gate and third gate comprises a gate electrode and a gate oxide, and the material of the gate electrode and the gate oxide of the first gates, the second gates and the third gates is identical.

In one embodiment, the oxide of the first, second and/or third gates is chosen from $SiO_2$, $HfO_2$ or $Al_2O_3$.

In one embodiment, the thickness of the oxide of the first gates, second gates and/or third gates is between 5 nm and 10 nm.

In one embodiment, the electrodes of the first gates, second gates and/or third gates are made of a conductive material chosen from Ti, TiN, poly-Si or even W.

A second aspect of the invention relates to a method for manufacturing a semiconductor device from a substrate including a semiconductor layer, referred to as an active layer, at a first surface of said substrate (that is, on a first surface of said substrate or near the first surface of said substrate), the method comprising:

A step of depositing a first dielectric layer onto the first surface;

A step of depositing a support layer onto the first dielectric layer; and

A step of etching the support layer so as to form an array of first pillars forming a plurality of rows and a plurality of columns;

A step of conformally depositing a second dielectric layer onto the array of first pillars, the thickness deposited being chosen so as to fill the space between each first pillar and its nearest neighbours;

A step of etching the second dielectric layer so as to expose the first dielectric layer between each first pillar of the array of first pillars along the diagonals of said array of first pillars;

a step of depositing a first conductive layer so as to fill the apertures made during the step of etching the second dielectric layer;

a step of chemico-mechanically polishing the structure obtained at the end of the previous step so as to obtain an array of second conductive pillars at the apertures made during the step of etching the second dielectric layer, polishing stop being performed on the support layer so that the second conductive pillars are no longer in contact with each other at the end of this step and form the third gates;

A step of selectively removing the second dielectric layer so as to keep only the array of first pillars and the array of second pillars on the first dielectric layer;

A step of conformally depositing a third dielectric layer onto the array of first pillars and the array of second pillars, the thickness deposited being chosen so as to fill the space between each first pillar and the second pillars nearest to said first pillar;

A step of etching the third dielectric layer so as to expose the first dielectric layer between each first pillar of the array of first pillars along the rows and columns of said array of first pillars;

a step of depositing a second conductive layer so as to fill the apertures made during the step of etching the third dielectric layer;

a step of chemico-mechanically polishing the structure obtained at the end of the previous step, so as to obtain an array of third conductive pillars at the apertures made during the step of etching the third dielectric layer, polishing stop being performed on the support layer so that the third conductive pillars are no longer in contact with each other at the end of this step and form the first gates and the second gates;

A step of selectively removing the first pillars of the plurality of first pillars so as to expose the first dielectric layer at the location of said first pillars;

A step of selectively etching the first dielectric layer and the active layer over their entire thickness at the location of said first pillars removed during the previous step so as to obtain a plurality of apertures in the active layer.

By virtue of the method according to an aspect of the invention, it is possible to obtain a device according to an aspect of the invention by self-alignment using only one lithography tier. The method is thus greatly simplified compared with methods in the state of the art in which several lithography tiers (and therefore for which precise alignment is necessary) and/or partial screening of the gates are present.

Further to the characteristics just discussed in the previous paragraph, the method according to the second aspect of the invention may have one or more additional characteristics from among the following, considered individually or according to any technically possible combinations.

In one embodiment, the substrate is a "silicon-on-insulator" type substrate and the active layer is made in the silicon layer of the substrate located above the oxide.

In one embodiment, the material of the first dielectric layer is chosen from $SiO_2$, $HfO_2$ or $Al_2O_3$.

In one embodiment, the material of the support layer is a dielectric material.

In one embodiment, the distance d separating two adjacent first pillars and the height h of the first pillars at the end of the step of etching the support layer so as to form an array of first pillars are chosen so that h>d/2.

In one embodiment, the method comprises, at the end of the step of etching the second dielectric layer, a step of chemico-mechanically polishing the structure obtained at the end of the previous step.

In one embodiment, the method comprises, before the step of etching the third dielectric layer, a step of chemico-mechanically polishing the structure obtained at the end of the previous step.

In one embodiment, the method comprises, after the step of chemico-mechanically polishing the structure obtained at the end of the step of depositing a second conductive layer, a step of chemico-mechanically over-polishing the structure obtained at the end of the previous chemical mechanical polishing step.

In one embodiment, the method comprises, at the end of the step of selectively etching the first dielectric layer and the active layer, a step of depositing a fourth dielectric layer followed by a step of chemico-mechanically polishing said layer, polishing stop being performed on the second and third pillars.

The invention and its different applications will be better understood upon reading the following description and upon examining the accompanying figures.

BRIEF DESCRIPTION OF THE FIGURES

The figures are set forth by way of indicating and in no way limiting purposes of the invention.

FIG. 1 shows a schematic representation of a device according to an aspect of the invention.

FIG. 2A to FIG. 2C show a schematic representation of different substrates likely to be used in a device or method according to an aspect of the invention.

FIG. 3 shows a schematic representation of an SOI-type substrate used in a method according to an aspect of the invention and serving to illustrate the different steps of the method.

FIG. 4A to FIG. 4K show a schematic representation of the steps of the method according to an aspect of the invention (the step(s) associated with each figure are noted in brackets).

DETAILED DESCRIPTION

Unless otherwise specified, a same element appearing in different figures has a single reference.

Quantum Device for Forming an Array of Quantum Dots

A first aspect of the invention illustrated in [FIG. 1] relates to a quantum device DQ configured to form an array of quantum dots QD. For this, the device DQ comprises an active layer CA made of a semiconductor material. In an embodiment, this layer CA is a silicon (Si) or germanium (Ge) layer, but other semiconductor materials may be contemplated. It is in this active layer CA that the quantum dots QD are formed. For the record, a quantum dot QD is formed by an electrostatic potential well in which it is possible to trap one or more charged particles, for example one or more holes or one or more electrons.

The device QD according to an aspect of the invention also comprises a plurality of first gates G1 disposed along a plurality of rows LI, above the active layer CA. The device according to an aspect of the invention also comprises a plurality of second gates G2 disposed along a plurality of columns CO perpendicular to the rows LI of the plurality of rows LI, above the active layer CA. The device DQ according to an aspect of the invention further comprises a plurality of third gates G3, each third gate G3 of the plurality of third gates G3 being disposed at the intersection of a row LI of the plurality of rows LI and a column CO of the plurality of columns CO, above the active layer CA, each third gate G3 being separated from the nearest third gates G3, on a row LI by a first gate G1 and on a column CO by a second gate G2. Finally, in the device DQ according to an aspect of the invention, the active layer CA comprises apertures OU over the entire thickness of the active layer CA, said apertures being disposed between the rows LI of the plurality of rows LI and the columns CO of the plurality of columns CO (thus the apertures OU also form an array offset with respect to the array of quantum dots QD).

The first gates G1 are separated from each other. They are also separate from the second and third gates. Thus, each first gate G1 can be polarised independently of the other gates. This makes it possible to apply an electrical potential to each first gate without simultaneously polarising the adjacent first, second and/or third gates. The first gates can thus be polarised independently of the adjacent gates.

In the same way, the second gates are separated from each other and from the first and third gates so as to be polarisable independently of the other gates. Similarly, the third gates are separated from each other and from the first and second gates so as to be polarisable independently of the other gates.

Thus, in the device DQ according to an aspect of the invention, a quantum dot QD may be formed below each third gate G3 so as to form an array of quantum dots QD. Indeed, each first gate G1 of the plurality of first gates G1 makes it possible, when an electrical potential is applied thereto, to modify potential barrier separating two parts of the active layer CA located under two adjacent third gates G3 along the rows. Similarly, each second gate G2 of the plurality of second gates G2 makes it possible, when an electrical potential is applied thereto, to modify potential barrier separating two parts of the active layer CA located under two adjacent third gates G3 along the columns CO. Additionally, the first gates G1 and the second gates G2 make it possible to perform this modification locally, the latter G1, G2 being above the active layer CA (in other words, there is no conductive layer between the oxide of the first gates G1 and the second gates G2 and the active layer CA). Also, by virtue of the control of the potential barriers exerted by the first gates G1 and the second gates G2, it is possible to achieve electrostatic confinement of charged particles below the third gates G3 of the plurality of third gates G3 to form a quantum dot QD under each third gate G3. This electrostatic confinement is further supplemented by structural confinement obtained by virtue of the apertures OR present in the active layer, since no charged particles can be located at said apertures OR.

Moreover, in each quantum dot QD, the charged particle(s) present are associated with a chemical potential. But, since each third gate G3 is above the part of the active layer CA in which a quantum dot is formed (in other words, there is no conductive layer between the oxide of the third gates G3 and the active layer CA), each third gate G3 of the plurality of third gates G3 makes it possible, when an electric potential is applied thereto, to modify chemical potential of the charged particles present in the quantum dot QD associated with the third gate G3 considered.

In the embodiment shown in [FIG. 1], the device comprises a single active layer CA having apertures and forming strips extending along rows LI and columns CO. All the first, second and third gates G1, G2, G3 extend entirely above the active layer CA. No gate extends only partially above the active layer CA. In other words, the active layer CA extends under each first, second and third gate G1, G2, G3. In particular, in the illustrated example, the active layer CA extends even beyond each aforementioned grid G1, G2, G3.

The first, second and third gates G1, G2, G3 form, for example, an assembly extending over the active layer CA. The said assembly has, for example, a first dimension, which can be measured along one of the rows LI of the plurality of rows LI or one column CO of the plurality of columns CO. The active layer CA has a second dimension, measured along the same row or the same column. The second dimension is then at least equal to the second dimension, so that each gate G1, G2, G3 extends over the active layer CA. In an embodiment, the second dimension is greater than the first dimension so that the gates G1, G2, G3 can be moved away from the edges of the layer CA.

In the embodiment shown in [FIG. 1], each first gate G1 and each second gate G2 has a rectangular shape. Each gate G1, G2 thus has a length and a width, measured in the plane (i.e. parallel to the active layer CA), its width being measured perpendicular to its length, its length being greater than or equal to its width. Each first gate G1 is arranged so that its length is aligned parallel to the rows LI. Each second gate G2 is arranged so that its length is aligned parallel to the columns CO. This particular alignment may be the result of the manufacturing process according to an aspect of the invention, detailed below.

The first and second gates G1, G2 may also have a thickness, measured perpendicular to the plane. For each gate G1, G2, its thickness is beneficially less than its length.

In [FIG. 1], each third gate G3 has the shape of a four-pointed star. Each of the branches is aligned along a row LI or a column CO. In other words, each third gate G3 has a first diagonal, passing through two of the opposite branches, parallel to the row LI on which said gate G3 is located. Each third gate G3 also has a second diagonal, distinct from the first diagonal, passing through two other of the opposite branches, parallel to the column CO on which said gate G3 is located. The shape and orientation of this shape for the third gates G3 may be the result of the manufacturing process implemented.

Thus, each first or second gate G1, G2, adjacent to a third gate G3, has its length aligned along one of the branches of said third gate G3.

More specifically, the first and second gates G1, G2 may have points, due to their rectangular shape. Each of the first and second gates G1, G2 may have a third diagonal, passing through two of the opposite points on the said gate. This third diagonal beneficially presents an angle with the one row LI which is less than or equal to 45°. In other words, the third diagonal of a first or second gate G1, G2, has an angle with one of the two diagonals of an adjacent third gate G3, which is less than or equal to 45°.

The first, second and third gates G1, G2, G3 beneficially have the same distance, to within 10%, from the active layer CA. This makes it possible to obtain a substantially identical gate/active layer coupling. The first, second and third gates G1, G2 and G3 are separated from the active layer CA by a dielectric layer, for example.

In one embodiment, the oxide of the first G1, second G2 and/or third G3 gates is chosen from $SiO_2$, $HfO_2$ or $Al_2O_3$. In one embodiment, the thickness of the oxide of the first gates G1, second gates G2 and/or third gates G3 is between 5 nm and 10 nm. In one embodiment, the electrodes of the first gates G1, second gates G2 and/or third gates G3 are made of a conductive material chosen from Ti, TiN or even W.

In an embodiment, the device according to the invention is made in an SOI type substrate and the active layer is a silicon layer. In this embodiment, the first, second and third gates G1, G2 and G3 are in direct contact with the active layer CA.

In one alternative embodiment, the device is made from a bulk silicon substrate. Beneficially, the substrate comprises an epitaxial silicon layer (denoted as [28]Si in the figure) covered with a thermal oxide (denoted as $SiO_2$ in the figure), this epitaxial silicon layer being deposited onto the intrinsic silicon layer (denoted as iSi in the figure) of the bulk silicon substrate. Such a substrate is illustrated in [FIG. 2A]. In this embodiment, the active layer CA is made in the silicon layer, beneficially the epitaxial silicon layer. It will be appreciated that the dimensions shown in the figure are given purely by way of illustration.

In one alternative embodiment, the device is made from an Si/SiGe heterostructure. A substrate comprising such a heterostructure is illustrated in [FIG. 2B]. This heterostructure comprises a layer whose Ge concentration (denoted as $Si_{1-x}Ge_x$ in the figure) changes linearly over time, on which an SiGe layer (denoted as $Si_{0.7}Ge_{0.3}$ in the figure) lies, a quantum well for electrons formed in an Si layer (denoted as [28]Si in the figure), a spacer of (denoted as $Si_{0.7}Ge_{0.3}$ in the figure) located on the Si layer and a silicon layer (denoted as Si Cap in the figure). In this embodiment, the active layer is made in the Si layer. It will be appreciated that the dimensions indicated in the figure are given purely by way of illustration.

In one alternative embodiment, the device is made from a Ge/SiGe heterostructure. A substrate comprising such a heterostructure is illustrated in [FIG. 2C]. The latter comprises a layer whose Si concentration (denoted as $Si_{1-x}Ge_x$ in the figure) changes linearly over time, on which an SiGe layer (denoted as $Si_{0.2}Ge_{0.8}$ in the figure) lies, a quantum well for holes formed in a Ge layer (denoted as Ge in the figure), a SiGe spacer (denoted as $Si_{0.2}Ge_{0.8}$ in the figure) located on the Ge layer and a silicon layer (denoted as Si Cap in the figure). In this embodiment, the active layer is made in the Ge layer. It will be appreciated that the dimensions indicated in the figure are purely given by way of illustration.

Method for Manufacturing a Quantum Device Including an Array of Islands

A second aspect of the invention illustrated in [FIG. 3] to [FIG. 4K] relates to a method for manufacturing a semiconductor device according to an aspect of the invention from an SB substrate comprising a semiconductor layer, referred to as the active layer CA, on a first surface of said SB substrate or near the first surface. By near the first surface, it is meant that the distance separating the active layer from the first surface is less than the distance separating the active layer from the second surface of the substrate opposite to the first surface. In an embodiment the distance separating the active layer CA from the first surface of the substrate SB is less than 500 nm, in an embodiment less than 200 nm or even less than 100 nm. In one embodiment, the thickness of the active layer CA is between 5 and 20 nm, for example equal to 10 nm.

In one embodiment, the active layer CA is made of silicon, the substrate in an embodiment being an SOI (Silicon-On-Insulator) type substrate. In one alternative embodiment, the substrate is an SiMOS type substrate as previously described. In one alternative embodiment, the substrate comprises an Si/SiGe heterostructure as previously described at its first surface. In one alternative embodiment, the substrate comprises a Ge/SiGe heterostructure as previously described at its first surface.

The method according to an aspect of the invention comprises a step E1 of depositing a first dielectric layer D1 onto the first surface. When the active layer CA is at this first surface (as illustrated in [FIG. 3] to [FIG. 4K], then this deposition is performed onto the active layer CA. In one embodiment, the material of the first dielectric layer D1 is chosen from $SiO_2$, $HfO_2$ or $Al_2O_3$. In one embodiment, the first dielectric layer D1 is made of a high permittivity dielectric material. In one embodiment, the first dielectric layer D1 includes several dielectric sublayers. For example, it includes an $SiO_2$ first sublayer ensuring a good quality interface with the layer onto which it is deposited (for example the Si active layer), then a $HfO_2$ or $Al_2O_3$ second sublayer. It will be appreciated that this is only an example and other combinations may be contemplated.

The method then comprises a step E2 of depositing a support layer SP onto the first dielectric layer D1. In one embodiment, the material of the support layer SP is a dielectric material, for example silicon nitride.

As illustrated in [FIG. 4B], the method then comprises a step E3 of etching the support layer so as to form an array of first pillars PI forming a plurality of rows and a plurality of columns. In an embodiment, the distance d separating two neighbouring first pillars PI and the height h of the first pillars PI are chosen so that h>d/2. In an embodiment, the height h of the first pillars is between 50 nm and 500 nm, for example equal to 200 nm.

The method also comprises a step E4 of conformally depositing a second dielectric layer D2 onto the array of first pillars PI, the thickness deposited being chosen so as to fill the space between each first pillar PI and its nearest neighbours. In one embodiment, the dielectric layer D2 is made of $SiO_2$. In one embodiment, the second dielectric layer D2 includes several dielectric sublayers.

The method then comprises a step E5 of etching the second dielectric layer D2 so as to expose the first dielectric layer D1 between each first pillar PI of the array of first pillars PI along the diagonals of said array of first pillars PI, the first dielectric layer D1 serving as an etching stop layer. In one exemplary embodiment, the second dielectric layer D2 is an $SiO_2$ layer and the first dielectric layer D1 (serving as a barrier layer) is a $HfO_2$ or $Al_2O_3$ layer. The structure obtained after these two steps is illustrated in [FIG. 4C], the exposed zones of the first dielectric layer D1 being marked by a dotted circle in the top representation at the bottom of the figure.

In one embodiment, the method also comprises a step E6 of chemico-mechanically polishing the structure obtained at the end of the previous step E5. Although optional, this step E6 makes it possible to flatten the surface of the structure and thus to improve the quality of the deposition of the conductive layer C1 described below. Furthermore, carrying out the chemical mechanical polishing in two stages avoids any selectivity problems with the chemical mechanical polishing performed at the end of the deposition of the conductive layer C1 described below.

The method according to an aspect of the invention then comprises a step E7 of depositing a first conductive layer C1 so as to fill the apertures made during step E5 of etching the second dielectric layer D2. Thus, at these apertures, the conductive layer C1 is in direct contact with the first dielectric layer D1. In one embodiment, the material of the conductive layer C1 is chosen from Ti, TiN or even W.

The method according to an aspect of the invention further comprises a step E8 of chemico-mechanically polishing the structure obtained at the end of the previous step E7 so as to obtain an array of second conductive pillars PC1 at the apertures made during the step E5 of etching the second dielectric layer D2. During this step E8, polishing stop is performed on the support layer SP so that the second pillars PC1 are no longer in contact with each other at the end of this step E8. The structure obtained at the end of these two steps or three steps (when the optional chemical mechanical polishing step E6 is implemented) is illustrated in [FIG. 4D]. In the final structure obtained at the end of the method according to an aspect of the invention, the second conductive pillars PC1 will form the third gates G3 of [FIG. 1] making it possible to control the chemical potential of the charged particles at the quantum dots QD.

As illustrated in [FIG. 4E], the method then comprises a step E9 of selectively removing the second dielectric layer D2 so as to keep only the array of first pillars PI and the array of second pillars PC1 on the first dielectric layer (D1). During this removal step, the first dielectric layer D1 is preserved and serves as a stop layer.

The method then comprises a step E10 of conformally depositing a third dielectric layer D3 onto the array of first pillars PI and onto the array of second pillars PC1, the thickness deposited being chosen so as to fill the space between each first pillar PI and the second pillars PC2 nearest to said first pillar PI.

The method also comprises a step E11 of etching the third dielectric layer D3 so as to expose the first dielectric layer D1 between each first pillar PI of the array of first pillars PI along the rows and columns of said array of first pillars PI. The structure obtained at the end of these two steps is illustrated in [FIG. 4F], the exposed zones of the first dielectric layer D1 being marked by a dotted circle.

In one embodiment, the method comprises a step of chemico-mechanically polishing the structure obtained at the end of the previous step E11 (not represented in the figures). Although optional, this step makes it possible to flatten the surface of the structure and thus improve the quality of the deposition of the conductive layer C2 described below. Furthermore, carrying out the chemical mechanical polishing in two stages avoids any selectivity problems with the chemical mechanical polishing performed at the end of the deposition of the conductive layer C2 described below.

As illustrated in [FIG. 4G], the method then comprises a step E12 of depositing a second conductive layer C2 so as to fill the apertures made during step E11 of etching the third dielectric layer D3. Thus, at these apertures, the second conductive layer C2 is in direct contact with the first dielectric layer D1. In one embodiment, the material of the second conductive layer C2 is chosen from Ti, TiN or even W.

As a result of the method, each first, second and third gate G1, G2, G3 extends against the first dielectric layer D1. The latter D1 is also common to all the gates G1, G2, G3.

The method then comprises a step E13 of chemico-mechanically polishing the structure obtained at the end of the previous step, so as to obtain an array of third conductive pillars PC2, said third conductive pillars PC2 being in direct contact with the first dielectric layer D1 at the apertures made during step E11 of etching the third dielectric layer D3. During this step E13, polishing stop is performed on the support layer SP so that the third pillars PC2 are no longer connected to each other at the end of this step E13. In one embodiment, in order to ensure that the third pillars are properly disconnected from one another, a step E14 of chemico-mechanically over-polishing the structure obtained at the end of step E13 is implemented. By "over-polishing", it is meant continuing polishing when the stop layer has been reached. Indeed, detection that the stop layers have been reached by polishing is performed automatically by physical detection of a polishing signal from the stop layer. But, if there are thickness non-uniformities across the plate, the signal may be detected even though the barrier layer has not been reached on the whole plate, but only on part of it. "Over-polishing" therefore allows polishing to continue long enough after the signal has been detected so that all the zones on the plate are sufficiently polished. The structure obtained at the end of this step E13 or both steps (when the optional over-polishing step E14 is implemented) is illustrated in [FIG. 4H]. In the final structure, the third conductive pillars PC2 will form the first gates G1 and the second gates G2 of [FIG. 1] to control the potential barrier between two adjacent quantum dots QD.

As illustrated in [FIG. 4I], the method then comprises a step E15 of selectively removing the first pillars PI of the plurality of first pillars PI so as to expose the first dielectric layer D1 at the location of said first pillars PI. When the material of the first pillars is a dielectric, for example SiN, this removal step can be implemented by a selective wet etching method, for example based on $H_3PO_4$.

As illustrated in [FIG. 4J], the method also comprises a step E16 of selectively etching (with respect to the conductive materials of the conductive pillars PC1, PC2) the first dielectric layer D1 and part of the substrate comprising the active layer CA over the entire thickness of the active layer CA at the location of the first pillars PI removed during the previous step E15 so as to form apertures OU in the active layer CA.

When the substrate is of the SOI type, then the Si active layer is etched over its entire thickness during this step E16. When the substrate is of the SiMOS type, then the $SiO_2$ layer and the Si layer (active layer) are etched over their entire thickness during this step E16. When the substrate comprises an Si/SiGe heterostructure, then the Si cap layer, the SiGe spacer and the Si layer (active layer CA) are etched over their entire thickness during this step E16. When the substrate comprises a Ge/SiGe heterostructure, then the Si cap layer, the SiGe spacer and the Ge layer (active layer CA) are etched over their entire thickness during this step E16.

Removing the active layer CA (and the layers above it where necessary) ensures that charged particles cannot be located in this zone, which facilitates their confinement to the quantum dots formed below the second conductive pillars PC1. In the final structure, the apertures thus made correspond to the apertures OU of [FIG. 1], ensuring the absence of charged particles between the rows LI and the columns CO.

In one embodiment, the method comprises a step E17 of depositing a fourth dielectric layer followed by a step E18 of chemico-mechanically polishing said layer, polishing stop being performed on the second and third pillars PC1, PC2. The structure obtained after these two steps is illustrated in [FIG. 4K].

As shown in [FIG. 1] and [FIG. 4K], in the device thus obtained, the third gates G3 in an embodiment have central symmetry and the distribution of the first gates G1 and second gates G2 adjacent to each third gate G3 is performed according to this symmetry. Similarly, the first, second and third gates G1, G2, G3 are in an embodiment distributed symmetrically with respect to the axis associated with each row LI and the axis associated with each column CO.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

It will be appreciated that the various embodiments and aspects of the inventions described previously are combinable according to any technically permissible combinations.

The invention claimed is:

1. A quantum device configured to form an array of quantum dots, the device comprising:
    an active layer made of a semiconductor material;
    a plurality of first gates disposed along a plurality of rows, each first gate of the plurality of first gates extending entirely over the active layer;
    a plurality of second gates disposed along a plurality of columns perpendicular to the rows of the plurality of rows, each second gate of the plurality of second gates extending entirely over the active layer;
    a plurality of third gates, each third gate of the plurality of third gates being disposed at the intersection of one row of the plurality of rows and one column of the plurality of columns, each third gate being separated from the nearest third gates, on a row by a first gate and on a column by a second gate,
    the active layer comprising apertures over the entire thickness of the active layer disposed between the rows of the plurality of rows and the columns of the plurality of columns.

2. The device according to claim 1, wherein each third gate of the plurality of third gates extends entirely over the active layer.

3. The device according to claim 1, wherein each gate of the pluralities of first, second and third gates extends over a first dimension, forming a first width, measured along a row or a column, the active layer having a second dimension, forming a second width, measured along said row or said column, greater than or equal to the first width.

4. The device according to claim 1, wherein each first gate has a length and a width less than or equal to the length, each first gate being arranged so that its length is aligned with one row of the plurality of rows; and wherein each second gate has a length and a width less than or equal to the length, each second gate being arranged so that its length is aligned with one column of the plurality of columns.

5. The device according to claim 2, wherein each third gate has the shape of a four-pointed star, a first diagonal of which, passing through two opposite points, is parallel to a row of the plurality of rows, and a second diagonal of which, distinct from the first diagonal and passing through two other opposite points, is parallel to a column of the plurality of columns.

6. The device according to claim 2, wherein the first, second and third gates are arranged at the same distance from the active layer.

7. The device according to claim 2, comprising a first dielectric layer extending over the active layer, each first gate, each second gate and each third gate extending over the first dielectric layer, the first dielectric layer being common to all the gates.

8. The device according to claim 2, wherein the plurality of first gates are independently polarisable from the plurality of third gates.

9. The device according to claim 2, wherein the plurality of second gates is polarisable independently of the plurality of third gates.

10. The device according to claim 2, wherein each of the plurality of first, second and third gates is independently polarisable from the other of the plurality of first, second and third gates.

11. The device according to claim 2, wherein each of the first, second and third gates is polarisable independently of the other of the first, second and third gates.

12. The device according to claim 1, wherein the active layer is made in the Si layer of an Si/SiGe heterostructure.

13. The device according to claim 2, comprising spacers arranged so as to:
    separate each first gate from adjacent first, second and third gates;
    separate each second gate from adjacent first, second and third gates; and
    separating each third gate from adjacent first, second and third gates.

14. A method for manufacturing the quantum device according to claim 1 from a substrate including a semiconductor layer, forming an active layer, at a first surface of said substrate, the method comprising:
    depositing a first dielectric layer onto the first surface;
    depositing a support layer onto the first dielectric layer;
    etching the support layer so as to form an array of first pillars forming a plurality of rows and a plurality of columns;
    conformally depositing a second dielectric layer onto the array of first pillars, the thickness deposited being chosen so as to fill the space between each first pillar and its nearest neighbours;
    etching the second dielectric layer so as to expose the first dielectric layer between each first pillar of the array of first pillars along the diagonals of said array of first pillars;
    depositing a first conductive layer so as to fill the apertures made during the etching of the second dielectric layer;
    chemico-mechanically polishing the structure obtained at the end of the previous step so as to obtain an array of second conductive pillars at the apertures made during the etching the second dielectric layer, polishing stop being performed on the support layer so that the second conductive pillars are no longer in contact with each other at the end of the chemico-mechanically polishing and form the third gates;

selectively removing the second dielectric layer so as to keep only the array of first pillars and the array of second pillars on the first dielectric layer;

conformally depositing a third dielectric layer onto the array of first pillars and the array of second pillars, the thickness deposited being chosen so as to fill the space between each first pillar and the second pillars nearest to said first pillar etching the third dielectric layer so as to expose the first dielectric layer between each first pillar of the array of first pillars along the rows and columns of said array of first pillars;

depositing a second conductive layer so as to fill the apertures made during the etching of the third dielectric layer;

chemico-mechanically polishing the structure obtained at the end of the depositing of the second conductive layer, so as to obtain an array of third conductive pillars at the apertures made during the etching of the third dielectric layer, polishing stop being performed on the support layer so that the third conductive pillars are no longer in contact with each other at the end of the chemico-mechanically polishing and form the first gates and the second gates;

selectively removing the first pillars of the plurality of first pillars so as to expose the first dielectric layer at the location of said first pillars;

selectively etching the first dielectric layer and the active layer over their entire thickness at the location of said first pillars removed during the selectively removing of the first pillars so as to obtain a plurality of apertures in the active layer.

15. The method according to claim 14, wherein the substrate is a silicon-on-insulator substrate and the active layer is formed in the silicon layer of the substrate.

16. The method according to claim 14, wherein a distance d separating two neighbouring first pillars and a height h of the first pillars at the end of the etching of the support layer so as to form an array of first pillars are chosen such that $h > d/2$.

* * * * *